United States Patent [19]

Harada et al.

[11] Patent Number: 5,196,398
[45] Date of Patent: Mar. 23, 1993

[54] PROCESS FOR PRODUCING THALLIUM TYPE SUPERCONDUCTING THIN FILM

[75] Inventors: Keizo Harada; Hideo Itozaki; Shuji Yazu, all of Hyogo, Japan

[73] Assignee: Sumitomo Electric Industries, Ltd., Osaka, Japan

[21] Appl. No.: 740,641

[22] Filed: Jul. 30, 1991

Related U.S. Application Data

[63] Continuation of Ser. No. 616,685, Nov. 21, 1990, abandoned, which is a continuation of Ser. No. 392,071, Aug. 10, 1989, abandoned.

Foreign Application Priority Data

Aug. 10, 1988 [JP] Japan .............................. 63-199398

[51] Int. Cl.$^5$ ............................................. B05D 5/12
[52] U.S. Cl. ........................................ 505/1; 505/731; 505/732; 505/742; 427/62; 427/343
[58] Field of Search ............... 505/1, 742, 731, 732, 505/783; 427/62, 63, 343

[56] References Cited

FOREIGN PATENT DOCUMENTS 345441 4/1989 European Pat. Off. .

OTHER PUBLICATIONS

Yamada et al, "Bulk and wire type Y-Ba-Cu oxide Superconductor" Jpn. J. Appl. Phys. 26 Oct. 1987, Supplement 26-3.
Shih et al, "Multilayer deposition of Tl-Ba-Ca-Cu-O films" Appl. Phys. Lett. 53(6) Aug. 8, 1988 pp. 523-525.
Lee et al, "Superconducting Tl-Ca-Ba-Cu-O thin films with zero resistance at temperatures of up to 120k" Appl. Phys. Lett. 53(4) Jul. 1988 pp. 329-331.
Ginley et al, "Sequential electron beam evaporated films of $Tl_2CaBa_2Cu_2O_y$ with zero resistance at 97k", Appl. Phys. Lett. 53(5) Aug. 1, 1988 pp. 406–408.
Ichikawa et al, "Highly oriented superconducting Tl-Ca-Ba-Cu oxide thin films with 2-1-2-2 phase", Appl. Phys. Lett. 53(10) Sep. 1988 pp. 919-921.
Kang et al, "Large anistropy in the upper critical field of sputtered thin films of superconducting Tl-Ba-Ca-Cu-O", Appl. Phys. Lett. 53(25) Dec. 1988, pp. 2560-2562.
Z. Z. Sheng et al., Applied Physics Letters, "T1203 vapor process of making Tl-Ba-Ca-Cu-O superconductors"; (Dec. 1988); pp. 2686-2688.
R. W. Simon et al., Applied Physics Letters, "Low-loss substrate for epitaxial growth of high-temperature superconductor thin films"; (Dec. 1988): pp. 2677-2679.

*Primary Examiner*—Shrive Beck
*Assistant Examiner*—Roy V. King
*Attorney, Agent, or Firm*—Kerkam, Stowell, Kondracki & Clarke

[57] ABSTRACT

Improvement in heat-treatment of a superconducting thin film of thallium type compound oxide deposited on a substrate by PVD or CVD. In the invention, the heat-treatment is effected at a temperature between 880° C. and 920° C. for a predetermined time duration under such a condition that the partial pressure of thallium oxide becomes higher than the saturated vapour pressure of thallium oxide at said temperature.

7 Claims, 1 Drawing Sheet

PROCESS FOR PRODUCING THALLIUM TYPE SUPERCONDUCTING THIN FILM

This application is a continuation of Ser. No. 07/616,685 filed Nov. 21, 1990 (now abandoned), which was a continuation of Ser. No. 07/392,071 filed Aug. 10, 1989 (not abandoned).

BACKGROUND OF THE INVENTION

1. Field of the Invention

The present invention relates to an improvement in a process for producing superconducting films. More particularly, it relates to an improved process for producing thallium type superconducting thin films of thallium containing-compound oxides such as Tl-Ba-Ca-Cu type oxide having higher critical current density (Jc) as well as a high critical temperature (Tc).

2. Description of the Related Art

The superconductivity is a phenomenon which is explained to be a kind of phase change of electrons under which the electric resistance becomes zero and the perfect diamagnetism is observed. Under the superconducting condition, electric current of high density flows continuously without any loss of power, so that the power loss of about 7% which is lost in the electric power transmission today can be saved greatly when the technology of superconductivity can be applied to the electric power transmission. Development of superconductor is also demanded in the field of measurement in order to detect very weak magnetism by SQUID, in the field of medical treatment by $\pi$-neutrons and in the field of high-energy physical experiments. Superconductor is also requested in the field of electromagnets for generating a strong magnetic field in order to develop the technologies of fusion power generation, MHD power generation, magnetic levitation trains and magnetically propelling ships. The critical temperature "Tc" of superconductors, however, could no exceed 23.2 K of $Nb_3Ge$ which was the highest Tc for the past ten years.

The possibility of an existence of new types of superconducting material having much higher Tc was revealed by Bednorz and Müller, who discovered a new oxide type superconductors in 1986 (Z. Phys. B64, 1986 p. 189).

The new type compound oxide superconductor discovered by Bednorz and Müller is represented by $[La,Sr]_2CuO_4$ which is called the $K_2NiF_4$-type oxide having a crystal structure which is similar to known perovskite type oxides. The $K_2NiF_4$-type command oxides show such higher Tc as 30 K which is extremely higher than known superconducting materials. After that, a variety of compound oxides which show much higher critical temperatures were reported and hence the possibility of an actual utilization of the high Tc superconductors have burst onto the scene.

C. W. Chu et al. reported another superconducting material of so-called YBCO type represented by $YBa_2Cu_3O_{7-x}$ having the critical temperature of about 90 K (Physical Review Letters, Vol. 58, No. 9, p. 908). Maeda et al reported the other type new superconducting compound oxide of Bi-Sr-Ca-Cu-O system (Japanese Journal of Applied Physics, Vol. 27, No. 2, pp. 1209 to 1210).

Thallium type compound oxides are also high Tc superconductors of more than 100 K. The present inventors disclosed several kinds of thallium type compound oxides superconductors in a U.S. patent application Ser. No. 223,634 filed on Jul. 25, 1988 and Hermann et al. reported Tl-Ba-Ca-Cu-O system in Appl. Phys. Lett. 52 (20) p. 1738). Thallium type compound oxides are chemically more stable than the abovementioned YBCO type compound oxide and have such a very important merit that high Tc superconductors of higher than 100 K can be realized without using rare earth elements as a material so that the production cost can be reduced.

The above-mentioned new types oxide superconducting materials can be prepared in a form of a thin film on a substrate by physical vapour deposition (PVD) technique or chemical vapor deposition (CVD) technique.

In the case of production of thallium type oxide superconductors, however, there is a special problem, because thallium (Tl) is a very volatile element and toxic for humans. In fact, thallium type superconducting thin films prepared by the conventional physical vapour technique show relatively lower Tc (critical temperature) and Jc (critical current density) than a balk or a block of this compound oxide which is prepared by sintering technique. It is thought that this difference may be caused by shortage of oxygen in the crystal of which the superconducting thin film is made.

Heretofore, it is a usual practice to anneal a deposited thin film at 600° to 900° C. in the presence of oxygen gas in order to improve the superconducting properties of oxide type superconducting thin films deposited. This technique, however, is not effective in the case of thallium type superconducting thin films because thallium has a high vapour pressure and hence a majority of thallium atoms in the thin film escape from the thin film, so that the resulting thin film does not show desired high Tc and Jc.

Therefore, an object of the present invention is to overcome the problems of the prior art and to provide an improved process for producing superconducting thin films of thallium (Tl) type compound oxides.

SUMMARY OF THE INVENTION

The present invention provides a process for producing a superconducting thin film of thallium type compound oxide, comprising depositing a thin film of thallium-containing compound oxide on a substrate by physical vapour deposition method or chemical vapour deposition method and then subjecting the resulting thin film to heat-treatment, characterized in that the heat-treatment is effected at a temperature between 880° C. and 920° C. for a predetermined time duration under such a condition that the partial pressure of thallium oxide becomes higher than the saturated vapour pressure of thallium oxide at the temperature.

Preferably, the resulting heat-treated thin film is further subjected to secondary heat-treatment which is effected at a temperature between 600° C. and 900° C. for a predetermined time duration under such a condition that the partial pressure of thallium oxide becomes lower than the saturated vapour pressure of thallium oxide at said temperature.

The present invention is applicable for any superconducting thin film of compound oxide containing thallium (Tl). One typical thallium type compound oxide is represented by the general formula:

$$Tl_4(Ca_{1-x}Ba_x)_mCu_nO_{p+y}$$

in which m, n, x and y are numbers each satisfying ranges of $$6 \leq m \leq 16,$$

$$4 \leq n \leq 12$$

$$0.2 < x < 0.8$$

and $$-2 \leq y \leq +2,$$

respectively and $p=(6+m+n)$. For example, this type can having following compositions:

or

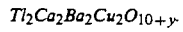

As the other type thallium-containing compound oxides to which the present invention is applicable, the following systems can be mentioned:

| | |
|---|---|
| Tl—Sr—Ca—Cu—O system | (75 to 100 K), |
| Tl—Pb—Sr—Ca—Cu—O system | (80 to 122 K), |
| Tl—Pb—Ba—Ca—Cu—O system | (90 to 122 K), |
| (Tl, La, Pb)—Sr—Ca—Cu—O system | (100 K), |
| Tl—Ba—(Y, Ca)—Cu—O system | (92 K), |
| Tl—Pb—Ca—Ce—Sr—Cu—O system | (95 K), |
| Tl—Ba—Ce—Cu—O system | (90 K), |
| (Tl, Ln)—Sr—Ca—Cu—O system | (80 to 90 K), |
| (Bi, Tl)—Sr—Cu—O system | (90 K), |
| Pb—Tl—Sr—Cu—O system | (42 K), |
| La—Tl—Sr—Cu—O system | (37 K) and |
| Nd—Tl—Sr—Cu—O system | (44 K), |
| Tl—Bi—Sr—Ca—Cu—O system | (25 K). |

(note) Ln: lanthanoid

The superconducting thin film according to the present invention can be deposited on a substrate by physical vapour deposition (PVD) technique such as RF sputtering, vacuum deposition, ion-plating, MBE or by chemical vapor deposition (CVD) technique such as thermal CVD, plasma CVD, photo CVD, MOCVD or the like.

When RF magnetron sputtering, vacuum deposition or ion-plating method is used as the physical vapour deposition technique, the atomic ratio of metal elements contained in a vapour source or a target is adjusted according to difference in the evaporation rate as well as difference in adsorption rate of metal elements to the substrate. The vapour source is preferably a sintered mass which is prepared by power-sintering technique of a material powder mixture comprising metal elements and/or their oxides or carbonates or a sintered powder which is obtained by pulverizing the sintered mass. The vapour source can be also divided into a plurality of segments.

In the case of the molecular beam epitaxy (MBE), elemental metals of Tl, Ba, Ca and Cu or their compounds such as their oxides, carbonates, fluorides or the like are evaporated by means of a K-cell or an ion beam gun. In this case, oxygen is supplied, if necessary, separately or additionally into an evaporation atmosphere.

For example, a vapour source or a target for preparing a thin film of Tl-Ba-Ca-Cu-O type compound oxide is prepared as following:

At first, a powder mixture is prepared by mixing powders of compounds of Ba, Ca and Cu such as their oxides, carbonates, fluorides or the like. The powder mixture is then subjected to preliminary sintering operation and pulverization. The resulting preliminary sintered powder is mixed with a powder of thallium compound such as thallium oxide, thallium carbonate or thallium fluoride and is sintered finally. The resulting sintered mass thus obtained can be used directly or after pulverization as a vapour source, particularly, as a target for sputtering. This preparation method is very effective to adjust the atomic ratio of the vapour source or target because thallium is a very volatile and toxic element.

In either case, the composition of the thin film deposited can be varied in a wide range by adjusting the composition in the vapour source and/or by selecting a suitable combination of vapour sources. Generally speaking, supplement of oxygen into the evaporation atmosphere is ensured either by evaporating oxygen-containing compounds such as oxides or carbonates of Tl, Ba, Ca and Cu or by supplying oxygen gas separately into a vacuum chamber. In any case, the oxygen content in the atmosphere during deposition of the superconducting thin film must be controlled precisely in order to adjust the oxygen deficiency which is a critical factor to realize a superconducting thin film of high Tc on the substrate to a predetermined value.

The substrate on which the thin film is deposited can be a single crystal of MgO, $SrTiO_3$, $LaAlO_3$, $LaGaO_3$ or the like. When a single crystal of silicon is used as a substrate, it is preferable to cover a surface of the silicon substrate with a buffer layer such as MgO or $ZrO_2$. The superconducting thin film according to the present invention is preferably deposited on a {001} plane or {110} plane of these single crystals. In the course of the vapour deposition, the substrate is heated at a temperature between room temperature and 500° C.

Essence of the present invention reside in that a thin film of thallium type compound oxide deposited on a substrate by physical vapour deposition method or chemical vapour deposition method is heat-treated at a temperature between 880° C. and 920° C. for a predetermined time duration under such a condition that the partial pressure of thallium oxide vapour becomes higher than the saturated vapour pressure of thallium oxide at said temperature.

The present inventors confirmed such a fact that the thin film prepared according to the present invention shows a very smooth surface and is very homogeneous in composition which is thought to be one reason why the thin film according to the present invention shows very high Tc and Jc. In other words, the heat-treatment according to the present invention is effective to suppress escape of thallium vapour out of the thin film and to promote proper crystallization of the thin film.

When the temperature of heat-treatment is not higher than 880° C., a uniform smooth thin film can not be obtained because a mixture of different phases each having a different critical temperature is produced so that the total Tc of the thin film becomes lower. To the contrary, if the temperature of heat-treatment is not lower than 920° C., the evaporation of thallium (Tl) increases excessively so that it is difficult to adjust the composition of the thin film to desired atomic ratios and also it increases precipitates which do not contribute the superconductivity.

This first heat-treatment is effected preferably for a time duration between 1 minute and 10 hours. Advantage of the heat-treatment according to the present invention can not be expected if the heating time is not longer than 1 minute, while heat-treatment longer than 10 hours may not be effective to improve the superconducting property.

In a preferred embodiment, the resulting heat-treated thin film is further subjected to secondary heat-treatment which is effected at a temperature between 600° C. and 900° C. for a predetermined time duration under such a condition that the partial pressure of thallium oxide vapour becomes lower than the saturated vapour pressure of thallium oxide at the temperature. This secondary heat-treatment is effective to remove or drive off excess thallium atoms trapped in the thin film during the first heat-treatment so that the atomic ratio of thallium atoms in the final product is adjusted to a desired stoichiometric proportion. This secondary heat-treatment is preferably continued for a time duration between 5 minutes and 50 hours.

The above-mentioned heat-treatment condition that the partial pressure of thallium oxide becomes higher or lower than the saturated vapour pressure of thallium oxide at the temperature can be realized easily by carrying out the heat-treatment in the presence of thallium vapor and oxygen gas. In a simplest case, thallium oxide is used as a vapour source for realizing the condition. Another preferable vapour source is a thallium-containing compound such as Tl-Ba-Ca-Cu-O type compound oxide. In a variation, thallium gas and oxygen gas are supplied under control into a chamber in which the heat-treatment is effected.

In a preferred embodiment of the present invention, the condition is realized by creating a temperature gradient in a closed space in which the substrate having the thin film and a thallium oxide vapour source are placed in such a manner that the thallium oxide vapour source is heated at a higher temperature than the substrate. In this case the closed spaced is preferably delimited by a pipe made of precious metal such as silver (Ag) and having an opening communicating with an interior of the chamber.

In the heat-treatments, oxygen gas is always supplied into the atmosphere in addition to thallium oxide gas so that the oxygen content in the thin film is also adjusted to the desired stoichiometric proportion.

Now, the process according to the present invention is described with reference to FIG. 1 which illustrates on embodiment of how to carry out the present process.

Figure 1:
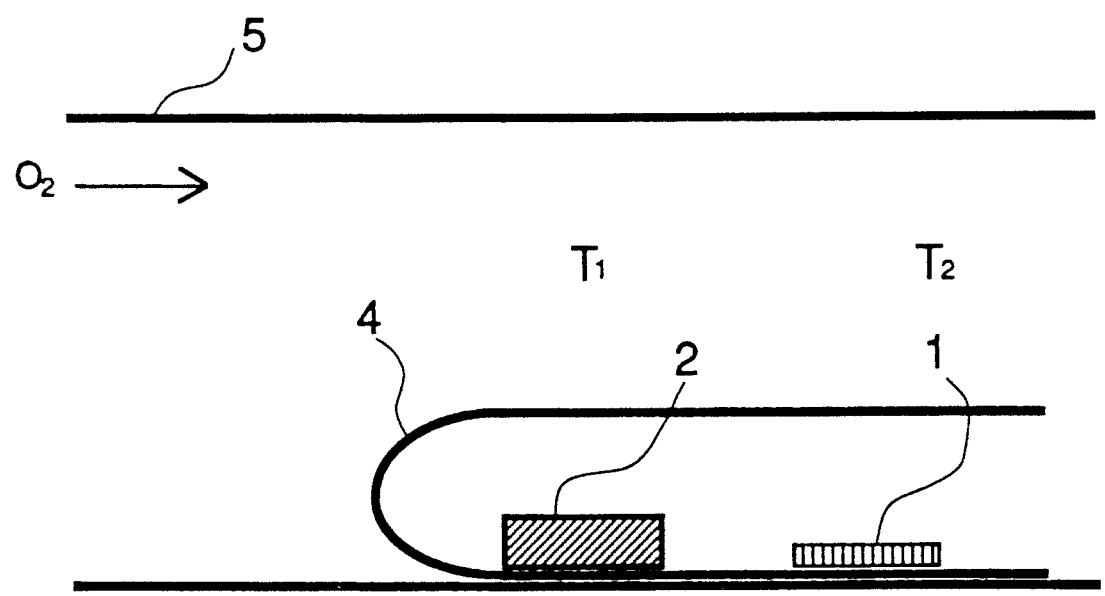
FIG. 1 is a drawing illustrating how to carry out the process according to the present invention.

A substrate (1) on which a thin film of thallium type compound oxide is deposited is placed in a pipe (4) made of silver (Ag) having an opening at an extreme end. In the silver pipe (4), a vapour source of thallium oxide (2) such as powder of thallium oxide is also placed. The vapour source of thallium oxide (2) can be a sintered mass or powder which is used for preparing the thin film deposited on the substrate in the physical vapour deposition stage.

The silver pipe (4) is set in a sintering furnace (5) into which oxygen gas ($O_2$) is supplied so that oxygen gas can penetrate into the silver pipe through its open end. Usually, the oxygen gas pressure can be about at ambient pressure (1 atm) but the heat-treatment can be effected also at a higher oxygen pressure than 1 atm.

In operation, a temperature gradient is created in the sintering furnace (5) in such a manner that substrate (1) on which a thin film of thallium type compound oxide is deposited is heated at a temperature $T_2$, while the vapour source of thallium oxide (2) is heated at a temperature $T_1$ respectively. The temperature $T_1$ is higher than the temperature $T_2$, for example, $T_1 = 930°$ C. and $T_2 = 900°$ C., so that the heat-treatment of the thin film deposited on the substrate (1) is effected at $T_2 = 900°$ C. in thallium oxide vapour produced from the vapour source (2) which is heated at a relatively higher temperature than the substrate (1). Under the above-mentioned temperature gradient, the vapour pressure of thallium oxide gas in the neighborhood of the thin film becomes higher than the saturated vapour pressure of thallium oxide (over-saturated vapour pressure). This first heat-treatment is continued for a desired time duration, usually more than one hour.

After this first heat-treatment is complete, a second heat-treatment is effected in the same apparatus except that the temperatures of $T_1$ and $T_2$ are lowered to an equal temperature such as $T_1 = T_2 = 850°$ C. for a desired time duration, usually more than one hour.

The process according to the present invention has the following merits:

(1) It is possible to adjust the atomic ratio of thallium in the thin film of compound oxide to a desired value, because the heat-treatment is effected in the saturated vapour pressure of volatile thallium so that escape of thallium atoms out of the thin film is suppressed.

(2) It is also possible to adjust the oxygen content in the thin film to a desired value because the heat-treatment is carried out in oxygen-rich condition.

(3) The thin film is not contaminated because the heat-treatment is effected in a pipe made of precious metal which is inactive to the thin film.

In conclusion, according to the process of the present invention, it becomes possible to producing high-quality superconducting thin film of thallium-containing compound oxides such as Tl-Ba-Ca-Cu type oxide superconductor improved in superconducting property, particularly in the critical current density Jc in a stable condition.

Now, the method according to the present invention is described with reference to Examples but the scope of the present invention should not limited to the following Examples.

EXAMPLE 1

Preparation of thin film of thallium type compound oxide

A thin film of thallium type compound oxide is deposited on a substrate of MgO single crystal by RF magnetron sputtering.

(1) Preparation of a target

Powders of $BaCO_3$ and CuO are kneaded in a mortar. The resulting powder mixture is sintered preliminarily at 900° C. for 8 hours. The resulting sintered mass is pulverized to a powder to which powders of $Tl_2O_3$ and CaO are admixed uniformly to prepare a material powder mixture. The atomic ratios of Tl:Ca:Ba:Cu in the material powder mixture are adjusted to 2.4:2.3:2.0:3.0.

The material powder mixture is pressed to a compact which is then wrapped by a foil made of gold (Au). The compact wrapped by the gold foil is then sintered is 905° C. for 3 hours in oxygen gas atmosphere in a sintering furnace.

(2) Deposition of a thin film

The resulting sintered mass is pulverized to obtain a sintered powder which is used as a powder target for RF magnetron sputtering which is carried out under the following conditions:

Substrate: {100} plane of a single crystal of MgO
Substrate temperature: 350° C.
High-frequency power: 0.64 W/cm$^2$
Sputtering gas: a mixed gas of Ar and $O_2$ $O_2$/(Ar+$O_2$)=0.2 (vol)
Sputtering pressure: $5 \times 10^{-2}$ Torr.

The resulting thin film is an amorphous film having a composition of Tl:Ba:Ca:Cu=2:2:2:3 and does not show superconducting property.

Heat-treatment according to the invention

The resulting substrate on which the thin film of thallium-containing compound oxide is deposited is heat-treated in a furnace illustrated in FIG. 1.

Namely, the substrate (1) is placed in a pipe made of silver (Ag) having an open end. In the silver pipe (4), a compound of Tl-Ba-Ca-Cu-O (2) which was prepared by the same method as is described in the "(1) preparation of a target" is also placed. This sintered mass (2) is prepared by the same process described in the preparation of the target.

Then, the silver pipe (4) is set in a sintering furnace (5) into which oxygen gas ($O_2$) of one atm is supplied.

A temperature gradient is created in the sintering furnace (5) in such a manner that substrate (1) is heated at 900° C. ($T_2$), while the Tl-Ba-Ca-Cu-O compound (2) is heated at 930° C. ($T_1$) respectively.

Under this temperature gradient, the vapour pressure of thallium oxide gas in the neighborhood of the substrate (1) becomes higher than the saturated vapour pressure of thallium oxide at 900° C. (over-saturated vapour pressure). This first heat-treatment is continued for one hour.

After this first heat-treatment is complete, second heat-treatment is effected in the same apparatus except that the temperatures of $T_1$ and $T_2$ are lowered to an equal temperature of $T_1=T_2=850°$ C. Under this temperature gradient, the vapour pressure of thallium oxide gas in the neighborhood of the substrate (1) becomes lower than the saturated vapour pressure of thallium oxide at 850° C. this secondary heat-treatment is continued for three hours.

The resulting superconducting thin film is evaluated by measuring the critical temperature Tc, the critical current density Jc and by observing their surfaces by a scanning electron microscope (SEM).

The critical temperature Tc is determined by usual four probe method. Temperature is measured by a calibrated Au(Fe)-Ag thermocouple. The critical current density (Jc) of the thin film obtained is determined at 77.0 K and is expressed by A/cm$^2$.

The results are shown in Table 1.

TABLE 1

| TC (K) | 125 K |
|---|---|
| Jc (77 K) | $3.2 \times 10^6$ A/cm$^2$ |
| Surface condition | smooth and uniform |

COMPARATIVE EXAMPLE 1

The Example 1 is repeated except that the first heat-treatment is omitted. Namely, the heat-treatment is effected in the same condition as the secondary condition which corresponds to the prior art.

The result on this case is shown in Table 2.

TABLE 2

| Tc (K) | 103 K |
|---|---|
| Jc (77 K) | $1.2 \times 10^4$ A/cm$^2$ |
| Surface condition | rough and not uniform |

Comparing Example 1 with Comparative Example 1, it is apparent that the superconducting property, particularly the critical current density improves remarkably.

EXAMPLE 2

The Example 1 is repeated except that the target is changed to prepare a different thin film of compound oxide having the following proportion:

$Tl_{0.7}Bi_{0.3}Ca_2Sr_2Cu_3O_2$

In this case, the target is prepared as follows: at first, a powder mixture of $Ba_2O_3$, CaO, $SrCO_3$ and CuO is sintered preliminarily at 700° C. for 10 hours. The resulting sintered mass is pulverized to a powder to which powder of $Tl_2O_3$ is admixed uniformly to prepare a material powder mixture which is sintered finally at 910° C. for 3 hours in the same manner as Example 1. The atomic ratios of the sintered mass are Tl:Bi:Ca;Sr;Cu=1:0.3:2.1:2:3.

A thin film is prepared and evaluated by the same method as Example 1. The result on this case is shown in Table 3.

TABLE 3

| Tc (K) | 115 K |
|---|---|
| Jc (77 K) | $3.1 \times 10^6$ A/cm$^2$ |
| Surface condition | smooth and uniform |

COMPARATIVE EXAMPLE 2

The Example 2 is repeated except that the first heat-treatment is omitted. Namely, the heat-treatment is effected in the same condition as the secondary condition which corresponds to the prior art.

The result on this case is shown in Table 4.

TABLE 4

| Tc (K) | 92 K |
|---|---|
| Jc (77 K) | $1.2 \times 10^4$ A/cm$^2$ |
| Surface condition | rough and not uniform |

EXAMPLE 3

The Example 1 is repeated except that the vapour source is changed to a power of thallium oxide ($Tl_2O_3$) and the thallium oxide powder is heated at 910° C. ($T_1$) and while the substrate is heated at 900° C. ($T_2$) in the first heat-treatment for 30 minutes.

The resulting thin film heat-treated is evaluated by the same method as Example 1. The result on this case is shown in Table 5.

TABLE 5

| Tc (K) | 124 K |
|---|---|
| Jc (77 K) | $3.5 \times 10^6$ A/cm$^2$ |
| Surface condition | smooth and uniform |

We claim:

1. A process for producing a superconducting film of a thallium type compound oxide with a critical current density Jc in the order of $10^6$ A/Cm$^2$ at 77 K comprising depositing a film of thallium-containing compound oxide on a substrate by physical vapor deposition method or chemical vapor deposition method and then subjecting the resulting film to a first heat-treatment, characterized in that said heat-treatment is effected at a temperature between 880° C. and 920° C. for a time duration under such conditions that the partial pressure of thallium oxide becomes higher than the saturated vapor pressure of thallium oxide at said temperature and the resulting heat-treated film is subjected to a second heat-treatment which is effected at a temperature between 600° C. and 900° C. for a time duration under such condition that the partial pressure of thallium oxide becomes lower than the saturated vapor pressure of thallium oxide at said temperature; said first and second heat-treatments being effected in an oxygen-containing atmosphere for more than one minute; said superconducting film of thallium type compound oxide having a composition represented by the general formula:

$$Tl_4(Ca_{1-x}Ba_x)_mCu_nO_{p+y}$$

in which m, n, x and y are numbers each satisfying ranges of $6 \leq m \leq 16$, $4 \leq n \leq 12$, $0.2 < x < 0.8$ and $-2 \leq y \leq +2$, respectively, and $p=(6+m+n)$.

2. The process set forth in claim 1 wherein the first and/or second heat-treatment is effect in a partially closed space delimited to a furnace.

3. The process set forth in claim 2 wherein said partially closed space is formed by a pipe made of precious metal having an opening communicating with an interior space of the furnace.

4. The process set forth in claim 1 wherein said condition that the partial pressure of thallium oxide becomes higher than the saturated vapour pressure of thallium oxide at said temperature is created by heating a thallium-containing compound at a temperature which is higher than said temperature at which said film is heat-ed-treated.

5. The process set forth in claim 4 wherein thallium-containing compound oxide is thallium oxide.

6. The process set forth in claim 4 wherein said thallium-containing compound oxide is a compound having the same composition as said film to be heat-treated.

7. The process set forth in claim 1 wherein said substrate is a single crystal of MgO, SrTiO$_3$, LaAlO$_3$ or LaGaO$_3$.

* * * * *

UNITED STATES PATENT AND TRADEMARK OFFICE
CERTIFICATE OF CORRECTION

PATENT NO. : 5,196,398

DATED : March 23, 1993

INVENTOR(S) : Keizo HARADA, et al.

It is certified that error appears in the above-identified patent and that said Letters Patent is hereby corrected as shown below:

Title Page, "Other Publications", "anistropy"
   should be -- anisotropy --.

Column 10, Claim 2, line 2, "effect" should be -- effected --.

Column 10, Claim 2, line 3, "to" should be -- in --.

Column 10, Claim 4, lines 6 and 7, "heat-ed-treated" should be
   -- heat-treated --.

Signed and Sealed this

Twenty-third Day of November, 1993

Attest:

BRUCE LEHMAN

Attesting Officer     Commissioner of Patents and Trademarks